United States Patent
Kim (10) Patent No.: US 11,982,702 B2
(45) Date of Patent: May 14, 2024

(54) MONITORING CIRCUIT MONITORING PERFORMANCE OF TRANSISTORS

(71) Applicant: SK hynix Inc., Gyeonggi-do (KR)

(72) Inventor: Sung Mook Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 270 days.

(21) Appl. No.: 17/511,342

(22) Filed: Oct. 26, 2021

(65) Prior Publication Data
US 2022/0349933 A1    Nov. 3, 2022

(30) Foreign Application Priority Data

Apr. 29, 2021  (KR) .................. 10-2021-0055659

(51) Int. Cl.
*G01R 31/26* (2020.01)
*H03K 17/687* (2006.01)

(52) U.S. Cl.
CPC ....... *G01R 31/2625* (2013.01); *H03K 17/687* (2013.01)

(58) Field of Classification Search
CPC .......... G01R 31/2625; G01R 19/00; G01R 31/3181; G01R 19/165; G01R 23/16; G01R 31/2879; H03K 17/687
See application file for complete search history.

(56) References Cited

U.S. PATENT DOCUMENTS

| | | | |
|---|---|---|---|
| 6,353,559 B2* | 3/2002 | Hasegawa | G11C 16/24 365/189.11 |
| 2009/0200962 A1* | 8/2009 | Yamamoto | H05B 45/38 315/291 |
| 2010/0127764 A1* | 5/2010 | Suzuki | H02M 3/073 327/541 |
| 2018/0313873 A1* | 11/2018 | Hu | G01R 19/0092 |

FOREIGN PATENT DOCUMENTS

| KR | 10-2019-0041878 A | 4/2019 |
|---|---|---|
| KR | 10-1999076 B1 | 10/2019 |

* cited by examiner

*Primary Examiner* — Akm Zakaria
(74) *Attorney, Agent, or Firm* — IP & T GROUP LLP (57) ABSTRACT

A monitoring circuit according to an embodiment of the present disclosure includes a booster configured to amplify a current amount between a terminal to which a power voltage is applied and a ground terminal to generate a sensing voltage, and an oscillator configured to output a sensing signal of which a frequency is adjusted in response to the sensing voltage, wherein the booster includes a transistor having a first size and a transistor having a second size greater than the first size, and wherein the oscillator includes a plurality of transistors having a third size greater than the first size.

20 Claims, 7 Drawing Sheets

| WT (CH length) | 1B | 2B | each of 1P – jP |
|---|---|---|---|
| | 1 | M | m |
| 1 < M  1 < m ||||

| | 3B | 4B | each of 1N – jN |
|---|---|---|---|
| WT (CH length) | 1 | N | n |
| 1 < N  1 < n | | | |

MONITORING CIRCUIT MONITORING PERFORMANCE OF TRANSISTORS

CROSS-REFERENCE TO RELATED APPLICATION

The present application claims priority under 35 U.S.C. § 119(a) to Korean patent application number 10-2021-0055659 filed on Apr. 29, 2021, the entire disclosure of which is incorporated by reference herein.

BACKGROUND

Field of Invention

The present disclosure relates to a monitoring circuit monitoring performance of transistors, and more particularly, to a monitoring circuit capable of monitoring performance of a PMOS or NMOS transistor.

Description of Related Art

An electronic system may be configured of a plurality of transistors, and may be capable of performing various functions according to a connection configuration of the plurality of transistors. For example, the electronic system may be configured to store data, or may be configured to perform various logical operations, and may also be configured to perform various functions, according to the connection configuration of the plurality of transistors.

As described above, since the electronic system may be configured to perform various functions by the connection configuration of the plurality of transistors, performance of the electronic system may vary according to performance of the plurality of transistors.

SUMMARY

An embodiment of the present disclosure provides a monitoring circuit capable of improving reliability of the monitoring circuit monitoring performance of transistors, by increasing a change amount of a frequency of a signal that varies according to the performance of the transistors.

In an embodiment of the present disclosure, a monitoring circuit includes a booster configured to amplify a current amount between a terminal to which a power voltage is applied and a ground terminal to generate a sensing voltage, and an oscillator configured to output a sensing signal of which a frequency is adjusted in response to the sensing voltage, wherein the booster includes a transistor having a first size and a transistor having a second size greater than the first size, and wherein the oscillator includes a plurality of transistors having a third size greater than the first size.

In an embodiment of the present disclosure, a monitoring circuit includes a first sensing circuit including PMOS transistors having different sizes, and configured to output a first sensing signal of which a frequency is adjusted according to a current generated by the PMOS transistors, and a second sensing circuit including NMOS transistors having different sizes, and configured to output a second sensing signal of which a frequency is adjusted according to a current generated by the NMOS transistors.

In an embodiment of the present disclosure, an electronic system includes a booster including first and second boosting transistors coupled in series between a power voltage terminal and a ground terminal and configured to output, through a first node, a sensing voltage corresponding to characteristics of the first and second boosting transistors, and an oscillator including a plurality of stages in a ring structure and configured to output a sensing signal through a second node in response to the sensing voltage, a frequency of the sensing signal being adjusted in proportion to the sensing voltage, wherein each of the plurality of stages incudes a pair of a third transistor and an inverter coupled in series between the power voltage terminal and the ground terminal, wherein the first boosting transistor has a first size, the second boosting transistor has a second size greater than the first size, the third transistor has a third size greater than the first size, and each of the first to third size indicates a length of a channel formed between two adjacent junction regions in a substrate.

The present technology may precisely monitor performance of transistors by amplifying a frequency that varies according to the performance of the transistors.

DETAILED DESCRIPTION

Specific structural or functional descriptions of embodiments according to the concept which are disclosed in the present specification are illustrated only to describe the embodiments according to the concept of the present disclosure. The embodiments according to the concept of the present disclosure may be carried out in various forms and should not be construed as being limited to the embodiments described in the present specification.

Figure 1:
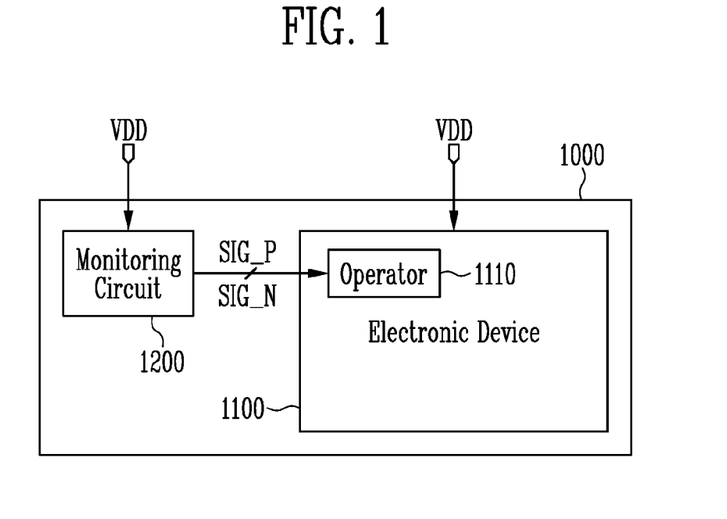
FIG. 1 is a diagram illustrating an electronic system according to an embodiment of the present disclosure.

FIG. 1 is a diagram illustrating an electronic system 1000 according to an embodiment of the present disclosure.

Referring to FIG. 1, the electronic system 1000 may include an electronic device 1100 and a monitoring circuit 1200.

The electronic system 1000 may be activated in response to an electrical signal, and may be configured to perform various operations according to a function of the electronic device 1100.

In an embodiment, the electronic device 1100 may be a device that performs a specific function, such as a sensor, a display device, or a communication device. In another embodiment, the electronic device 1100 may be a controller that performs a function of controlling a device such as a sensor, a display device, or a communication device. In still another embodiment, the electronic device 1100 may be a storage device that stores and outputs data.

The electronic device 1100 may include various types of transistors. For example, the electronic device 1100 may include a plurality of PMOS transistors and NMOS transistors. The transistors may be configured to electrically connect a source and a drain by forming a channel according to a voltage applied to a gate. Therefore, an electrical characteristic of the electronic device 1100 may vary according to an electrical characteristic of the transistors. Since the electrical characteristic of transistors may vary according to a manufacturing process of the electronic device 1100, the electronic device 1100 may set a current, a voltage, and the like for an internal operation according to the electrical characteristic of the transistors.

The monitoring circuit 1200 may be configured to sense the electrical characteristic of the transistors configuring the electronic device 1100, and output first and second sensing signals SIG_P and SIG_N. In some embodiments, the monitoring circuit 1200 may adjust a frequency of the first and second sensing signals SIG_P and SIG_N in order to easily sense the electrical characteristic of the transistors even though a power voltage VDD is decreased. For example, the monitoring circuit 1200 may include transistors for sensing a current. The monitoring circuit 1200 may be configured to increase a current amount by changing a size of the transistors and amplify the frequency of the first and second sensing signals SIG_P and SIG_N.

The electronic device 1100 may include an operator 1110 for calculating the frequency of the first and second sensing signals SIG_P and SIG_N output from the monitoring circuit 1200. The electronic device 1100 may set the current, the voltage, and the like suitable for the internal operation according to a value operated by the operator 1110.

That is, when a level of the power voltage VDD is low, a current flowing through the monitoring circuit 1200 also decreases, and thus the frequency of the first and second sensing signals SIG_P and SIG_N generated by the current may decrease. When the frequency decreases, it may be difficult for the operator 1110 to precisely operate the frequency of the first and second sensing signals SIG_P and SIG_N. The monitoring circuit 1200 of an embodiment may be configured to adjust the frequency of the first and second sensing signals SIG_P and SIG_N.

Figure 2:
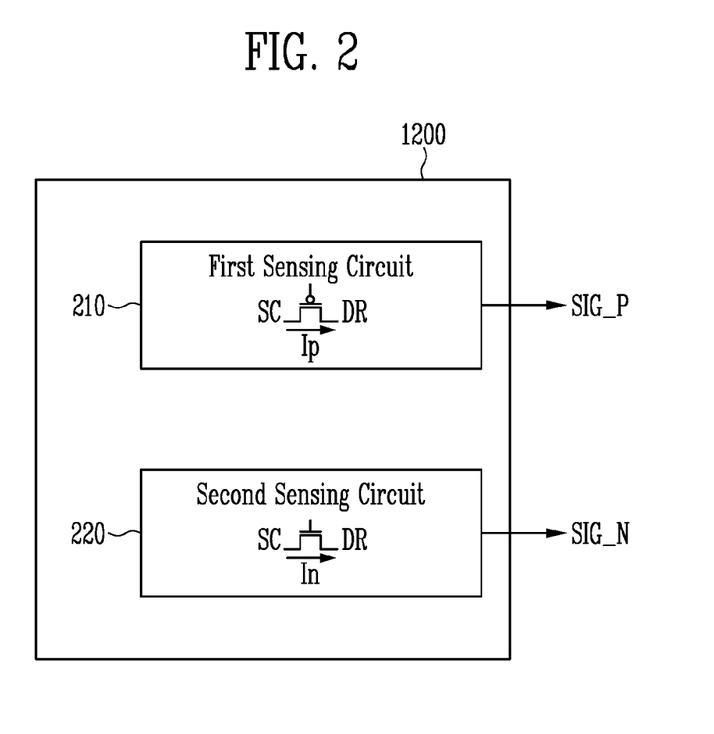
FIG. 2 is a diagram illustrating a monitoring circuit according to an embodiment of the present disclosure.

FIG. 2 is a diagram illustrating a monitoring circuit 1200 according to an embodiment of the present disclosure.

Referring to FIG. 2, the monitoring circuit 1200 may include a first sensing circuit 210 and a second sensing circuit 220 configured to sense performance of different types of transistors.

The first sensing circuit 210 may be configured to sense performance of a transistor of a first type. For example, the first sensing circuit 210 may be configured to sense performance of a PMOS transistor. The performance of the PMOS transistor may be determined by a current amount Ip flowing between a source SC and a drain DR thereof. In an embodiment, the performance of the PMOS transistor may increase as the current amount Ip increases, and the performance of the PMOS transistor may decrease as the current amount Ip decreases. For example, the first sensing circuit 210 may output the first sensing signal SIG_P having a higher frequency as the performance of the PMOS transistor is higher, and output the first sensing signal SIG_P having a lower frequency as the performance of the PMOS transistor is lower.

The second sensing circuit 220 may be configured to sense performance of a transistor of a second type different from the first type. For example, the second sensing circuit 220 may be configured to sense performance of a NMOS transistor. The performance of the NMOS transistor may be determined by a current amount In flowing between a source SC and a drain DR thereof. In an embodiment, the performance of the NMOS transistor may increase as the current amount In increases, and the performance of the NMOS transistor may decrease as the current amount In decreases. For example, the second sensing circuit 220 may output the second sensing signal SIG_N having a higher frequency as the performance of the NMOS transistor is higher, and output the second sensing signal SIG_N having a lower frequency as the performance of the NMOS transistor is lower.

Figure 3:
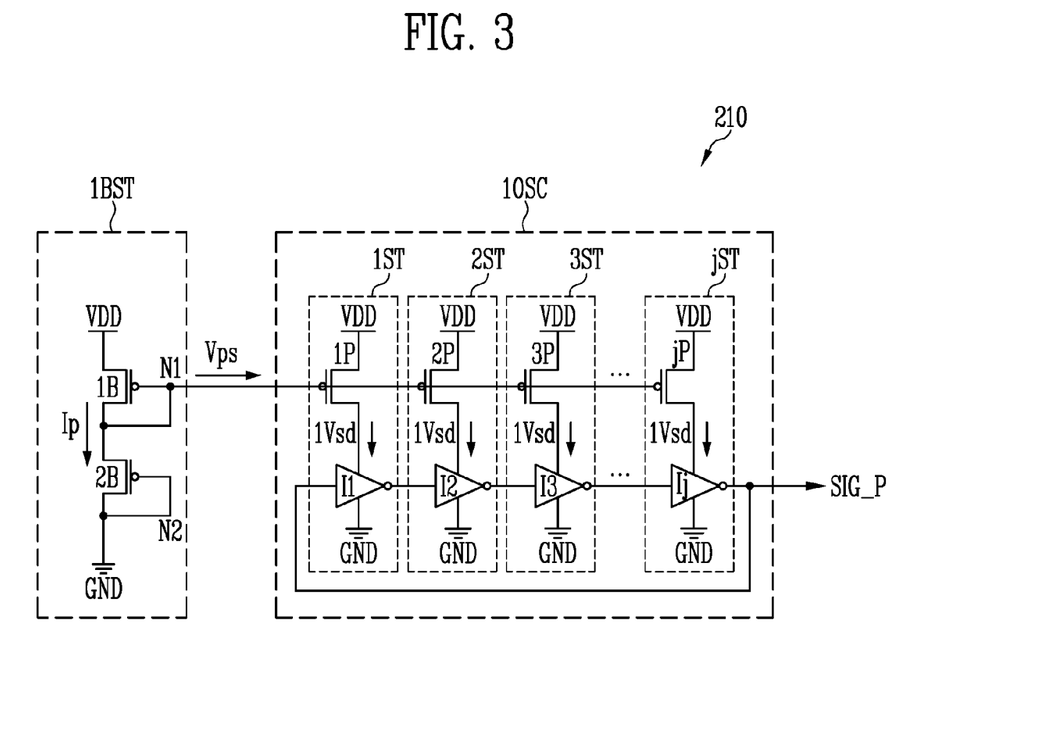
FIG. 3 is a diagram illustrating a first sensing circuit according to an embodiment of the present disclosure.

FIG. 3 is a diagram illustrating a first sensing circuit according to an embodiment of the present disclosure, e.g., the first sensing circuit 210 of FIG. 2.

Referring to FIG. 3, the first sensing circuit 210 may include a first booster 1BST and a first oscillator 1OSC. The first booster 1BST may be configured to increase a frequency of a first sensing voltage Vps generated by the PMOS transistors. The first oscillator 1OSC may be configured to output the first sensing signal SIG_P in response to the first sensing voltage Vps. A configuration of the first booster 1BST and the first oscillator 1OSC is described as follows.

The first booster 1BST may include first and second boosting transistors 1B and 2B connected in series between a terminal to which the power voltage VDD is applied and a ground terminal GND. The first and second boosting transistors 1B and 2B may be implemented as PMOS transistors. The first boosting transistor 1B may be adjacent to the terminal to which the power voltage VDD is applied, and the second boosting transistor 2B may be adjacent to the ground terminal GND. A gate of the first boosting transistor 1B may be connected to a first node N1, which may also be connected to a node between the first and second boosting transistors 1B and 2B. Therefore, a turn-on level of the first boosting transistor 1B may be adjusted in response to a voltage determined according to the current amount Ip between the first and second boosting transistors 1B and 2B. A gate of the second boosting transistor 2B may be connected to a second node N2, which may also be connected to the ground terminal GND.

In order to amplify the current amount Ip between the first and second boosting transistors 1B and 2B, a size of the second boosting transistor 2B may be implemented to be greater than that of the first boosting transistor 1B. For example, the size of the second boosting transistor 2B may be implemented to be greater than the size of the first boosting transistor 1B by M times (where M is a positive rational number greater than 1). As a size difference between the first and second boosting transistors 1B and 2B increases, the current amount Ip of the first node N1 may be increase. Further, when the current amount Ip increases, the frequency of the first sensing voltage Vps which is a voltage of the first node N1 may increase.

$$Ip = (M/(M+1)) \times GM \times VDD \qquad \text{[Equation 1]}$$

Referring to "Equation 1", the current amount Ip may be determined by M corresponding to the size of the second boosting transistor 2B, a gain GM of the transistor, and the power voltage VDD. Since the increase of the gain GM of the transistor means that the performance of the transistor increases, it is preferable to set a value of M to be large in order to increase the performance of the transistor. For example, when M is 10, about 90% of the gain GM may be reflected on the performance of the transistor, and when M is 100, about 99% of the gain GM may be reflected on the performance of the transistor. That is, the gain GM is proportional to the size of the transistor, and the current amount Ip is proportional to the gain GM.

The first oscillator 1OSC may be implemented as a ring oscillator. For example, the first oscillator 1OSC may include first to j-th stages 1ST to jST connected with each other in series. Here, j may be an odd number greater than or equal to 3. The first to j-th stages 1ST to jST may commonly operate in response to the first sensing voltage Vps, and may operate in a method in which the first sensing signal SIG_P having a clock form output from the j-th stage jST is fed back to the first stage 1ST. Since the first to j-th stages 1ST to jST are configured in the same structure, the structure of the first stage 1ST is described as an example as follows.

The first stage 1ST may include a first PMOS transistor 1P and a first inverter I1 connected in series between the terminal to which the power voltage VDD is applied and the ground terminal GND. The first PMOS transistor 1P may be turned on or turned off in response to the first sensing voltage Vps. When the first PMOS transistor 1P is turned on, the power voltage VDD may be output as a first sub voltage 1Vsd, and the first sub voltage 1Vsd may be supplied as an operation power of the first inverter I1, that is, the first inverter I1 receives the first sub voltage 1Vsd as a voltage source. The first sensing signal SIG_P output from the j-th stage jST may be input to an input terminal of the first inverter I1. A signal output from the first inverter I1 may be input to an input terminal of a second inverter I2 of the second stage 2ST. A size of the first PMOS transistor 1P may be implemented to be greater than that of the first boosting transistor 1B by m times (where m is a positive rational number greater than 1), and is not related to a size of the second boosting transistor 2B. When the size of the first PMOS transistor 1P is greater than that of the first boosting transistor 1B, a current amount flowing through the first PMOS transistor 1P and the first inverter I1 may increase. Further, when the current amount increases, a frequency of the first sub voltage 1Vsd may increase.

That is, in the first oscillator 1OSC, the number of first to j-th stages 1ST to jST may adjust a delay time of the first sensing signal SIG_P, sizes of first to j-th PMOS transistors 1P to jP which are greater than that of the first boosting transistor 1B may increase the frequency of the first sub voltage 1Vsd, and the frequency of the first sensing signal SIG_P may increase by the configuration of the first oscillator 1OSC.

Figure 4:
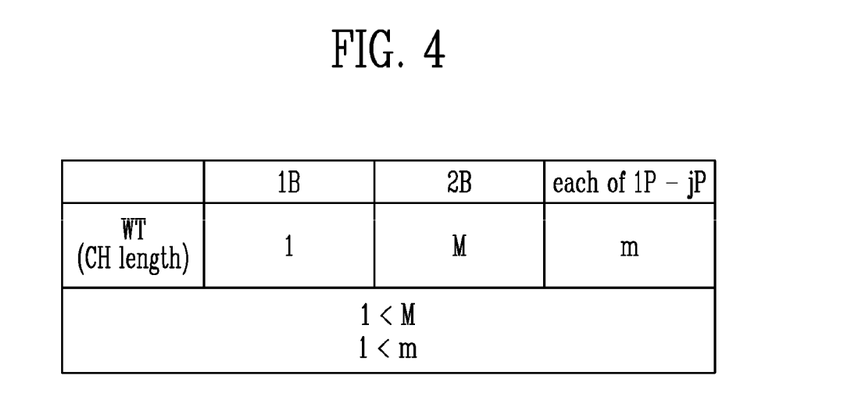
FIG. 4 is a diagram for comparing sizes of transistors included in a first sensing circuit according to an embodiment of the present disclosure.

FIG. 4 is a diagram for comparing sizes of transistors included in a first sensing circuit according to an embodiment of the present disclosure, e.g., the first sensing circuit 210 of FIG. 3.

Referring to FIGS. 3 and 4, the size of the transistors included in the first sensing circuit 210 means a width WT of each of the transistors. Here, the width WT of the transistors means a length of the channel CH. For example, a width of the first boosting transistor 1B is 1, a width of the second boosting transistor 2B may be M greater than 1, and a width of each of the first to j-th PMOS transistors 1P to jP may be m greater than 1.

Figure 5:
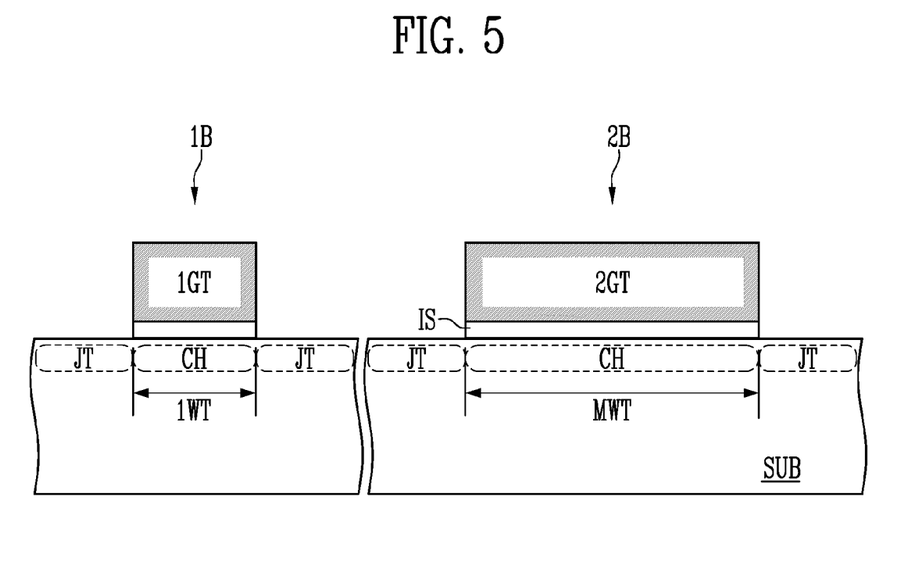
FIG. 5 is a cross-sectional view illustrating a size of transistors included in a first sensing circuit according to an embodiment of the present disclosure.

FIG. 5 is a cross-sectional view illustrating a size of transistors included in a first sensing circuit according to an embodiment of the present disclosure, e.g., the first sensing circuit 210 of FIG. 3.

Referring to FIG. 5, the first and second boosting transistors 1B and 2B may be configured of junction regions JT formed in a substrate SUB, and an insulating layer IS and gates 1GT and 2GT stacked on the substrate SUB. The size of the first boosting transistor 1B may be defined as the length of the channel CH formed between the two adjacent junction regions JT. For example, the first boosting transistor 1B may have a first width 1WT, and the first width 1WT is the same as a channel length of the first boosting transistor 1B. The size of the second boosting transistor 2B, which is greater than that of the first boosting transistor 1B, may be defined as the length of the channel CH formed between the two adjacent junction regions JT. For example, the second boosting transistor 2B may have an M-th width MWT that is wider than the first width 1WT, and the M-th width MWT is the same as the channel length of the second boosting transistor 2B. For example, the M-th width MWT is wider than the first width 1WT by M times.

Although not shown in FIG. 5, each of the first to j-th PMOS transistors 1P to jP shown in FIG. 3 may have an M-th width, and the M-th width MWT is wider than the first width 1WT by M times.

Figure 6:
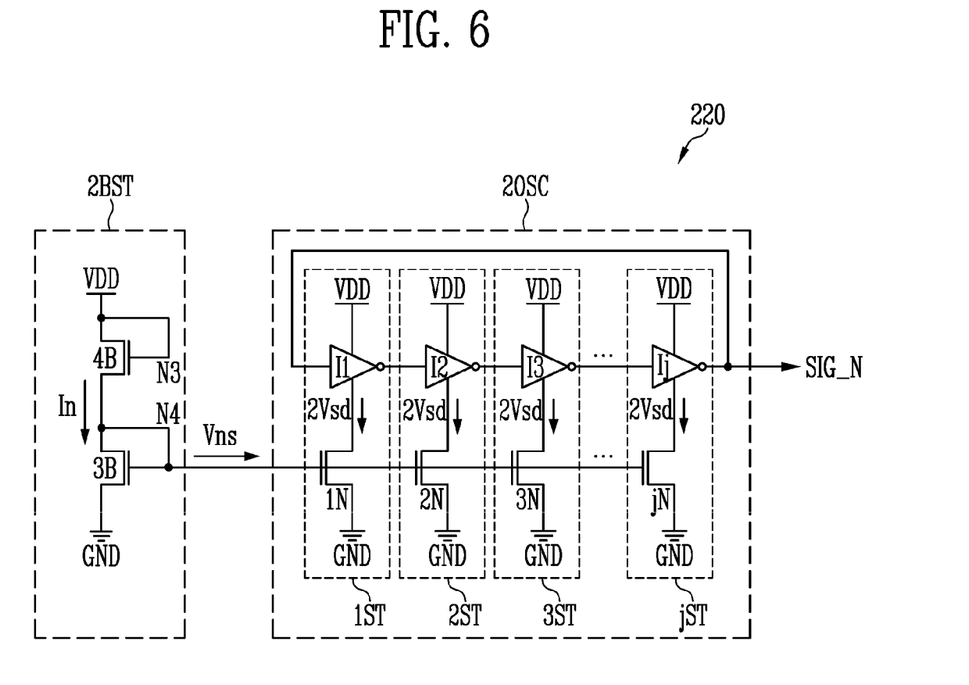
FIG. 6 is a diagram illustrating a second sensing circuit according to an embodiment of the present disclosure.

FIG. 6 is a diagram illustrating a second sensing circuit according to an embodiment of the present disclosure, e.g., the second sensing circuit 220 of FIG. 2.

Referring to FIG. 6, the second sensing circuit 220 may include a second booster 2BST and a second oscillator 2OSC. The second booster 2BST may be configured to increase a frequency of a second sensing voltage Vns generated by the NMOS transistors. The second oscillator 2OSC may be configured to output the second sensing signal SIG_N in response to the second sensing voltage Vns. A configuration of the second booster 2BST and the second oscillator 2OSC is described as follows.

The second booster 2BST may include third and fourth boosting transistors 3B and 4B connected in series between the terminal to which the power voltage VDD is applied and the ground terminal GND. The third and fourth boosting transistors 3B and 4B may be implemented as NMOS transistors. The fourth boosting transistor 4B may be adjacent to the terminal to which the power voltage VDD is applied, and the third boosting transistor 3B may be adjacent to the ground terminal GND. A gate of the fourth boosting transistor 4B may be connected to a third node N3, and the third node N3 may be connected to the terminal to which the power voltage VDD is applied. Therefore, the fourth boosting transistor 4B may be continuously turned on while the power voltage VDD is supplied to the third node N3. A gate of the third boosting transistor 3B may be connected to a fourth node N4 between the third and fourth boosting transistors 3B and 4B. Therefore, a turn-on level of the third boosting transistor 3B may be adjusted in response to a voltage determined according to the current amount In between the third and fourth boosting transistors 3B and 4B.

In order to amplify the current amount In between the third and fourth boosting transistors 3B and 4B, a size of the fourth boosting transistor 4B may be implemented to be greater than that of the third boosting transistor 3B. For example, the size of the fourth boosting transistor 4B may be implemented to be greater than that of the third boosting transistor 3B by N times (where N is a positive rational number greater than 1). As a size difference of the third and fourth boosting transistors 3B and 4B increases, the current amount In of the fourth node N4 may increase. Further, when the current amount In increases, a frequency of the second sensing voltage Vns that is a voltage of the fourth node N4 may increase.

The current amount In may be determined by N corresponding to the size of the fourth boosting transistor 4B, the gain GM of the transistor, and the power voltage VDD. The relationship of the current amount In, the gain, and the size of the transistor is similar to 'Equation 1' described above. Therefore, since the increase of the gain of the transistor means that the performance of the transistor is increased, it is preferable to set the value of N to be large in order to increase the performance of the transistor. Setting the value of N to be a large value means that the fourth boosting transistor 4B is formed larger than that of the third boosting transistor 3B by N times in a manufacturing step.

The second oscillator 2OSC may be implemented as a ring oscillator. For example, the second oscillator 2OSC may include first to j-th stages 1ST to jST connected in series. The first to j-th stages 1ST to jST of the second oscillator 2OSC may be configured to be physically different from the first to j-th stages 1ST to jST of the first oscillator 1OSC of FIG. 3. In the first to j-th stages 1ST to jST of the second oscillator 2OSC, j may be an odd number greater than or equal to 3. The first to j-th stages 1ST to jST may commonly operate in response to the second sensing voltage Vns, and may operate in a method in which the second sensing signal SIG_N having a clock form output from the j-th stage jST is fed back to the first stage 1ST. Since the first to j-th stages 1ST to jST are configured in the same structure, the structure of the first stage 1ST is described as an example as follows.

The first stage 1ST may include a first inverter I1 and a first NMOS transistor 1N connected in series between the terminal to which the power voltage VDD is applied and the ground terminal GND. The first inverter I1 may form a current path between the terminal to which the power voltage VDD is applied and the first NMOS transistor 1N. The second sensing signal SIG_N output from the j-th stage jST may be input to an input terminal of the first inverter I1. A signal output from the first inverter I1 may be input to an input terminal of a second inverter I2 included in the second stage 2ST. The first NMOS transistor 1N may be configured to receive a second sub voltage 2Vsd generated by a current of the first inverter I1 and turned on or turned off in response to the second sensing voltage Vns. When the first NMOS transistor 1N is turned on, a terminal to which the second sub voltage 2Vsd is applied and the ground terminal GND may be connected, and thus the second sub voltage 2Vsd may be decreased.

A size of the first NMOS transistor 1N may be implemented to be greater than that of the third boosting transistor 3B by n times (where n is a positive rational number greater than 1), and is not related to the size of the fourth boosting transistor 4B. When the size of the first NMOS transistor 1N is greater than the size of the third boosting transistor 3B, a current amount flowing between the first inverter I1 and the first NMOS transistor 1N increases. Further, when the current amount increases, a frequency of the second sub voltage 2Vsd may increase.

That is, in the second oscillator 2OSC, the number of first to j-th stages 1ST to jST may adjust a delay time of the second sensing signal SIG_N, sizes of the first to j-th NMOS transistors 1N to jN which are greater than that of the third boosting transistor 3B may increase the frequency of the second sub voltage 2Vsd, and the frequency of the second sensing signal SIG_N may increase by the configuration of the second oscillator 2OSC.

Figure 7:
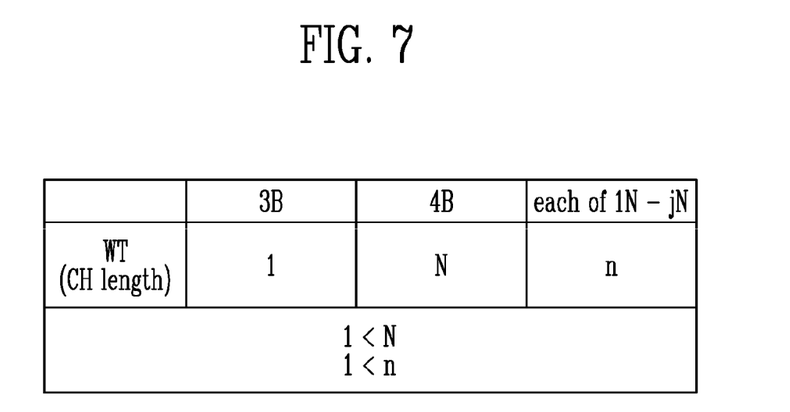
FIG. 7 is a diagram illustrating a size of transistors included in a second sensing circuit according to an embodiment of the present disclosure.

FIG. 7 is a diagram illustrating a size of transistors included in a second sensing circuit according to an embodiment of the present disclosure, e.g., the second sensing circuit 220 of FIG. 6.

Referring to FIGS. 6 and 7, the size of the transistors included in the second sensing circuit 220 means a width WT of each of the transistors. Here, the width WT of the transistors means a length of a channel CH. For example, the width of the third boosting transistor 3B is 1, a width of the fourth boosting transistor 4B may be N greater than 1, and a width of the first to j-th NMOS transistors 1N to jN may be n greater than 1.

Figure 8:
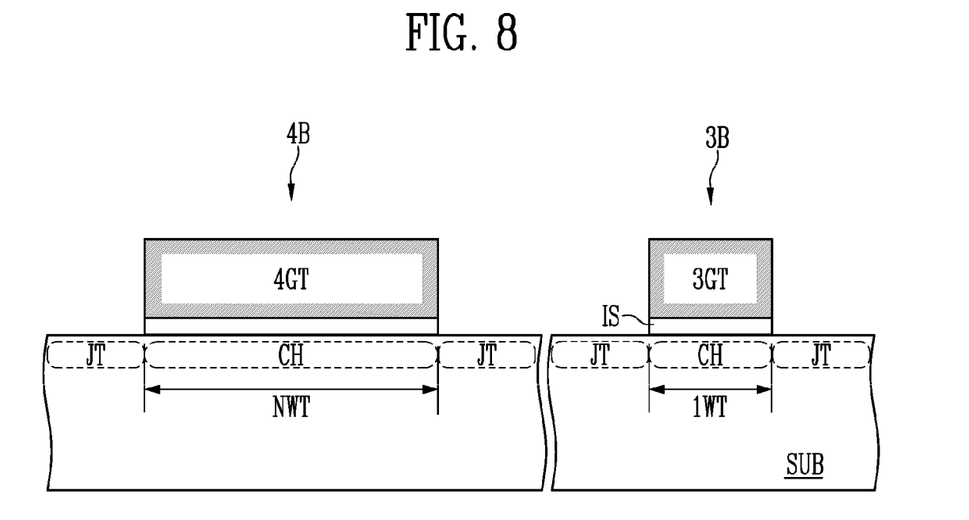
FIG. 8 is a cross-sectional view illustrating a size of transistors included in a second sensing circuit according to an embodiment of the present disclosure.

FIG. 8 is a cross-sectional view illustrating a size of transistors included in a second sensing circuit according to an embodiment of the present disclosure, e.g., the second sensing circuit 220 of FIG. 6.

Referring to FIG. 8, the third and fourth boosting transistors 3B and 4B may include junction regions JT formed in a substrate SUB, and an insulating layer IS and gates 3GT and 4GT stacked on the substrate SUB. The size of the third boosting transistor 3B may be defined as the length of the channel CH formed between the two adjacent junction regions JT. For example, the third boosting transistor 3B may have a first width 1WT, and the first width 1WT is the same as the channel length of the third boosting transistor 3B. The size of the fourth boosting transistor 4B, which is greater than that of the third boosting transistor 3B, may be defined as the length of the channel CH formed between the two adjacent junction regions JT. For example, the fourth boosting transistor 4B may have an N-th width NWT that is wider than the first width 1WT, and the N-th width NWT is the same as the channel length of the fourth boosting transistor 4B. For example, the N-th width NWT is wider than the first width 1WT by N times.

Although not shown in FIG. 8, each of the first to j-th NMOS transistors 1N to jN shown in FIG. 6 may have an N-th width, and the N-th width NWT is wider than the first width 1WT by N times.

Figure 9:
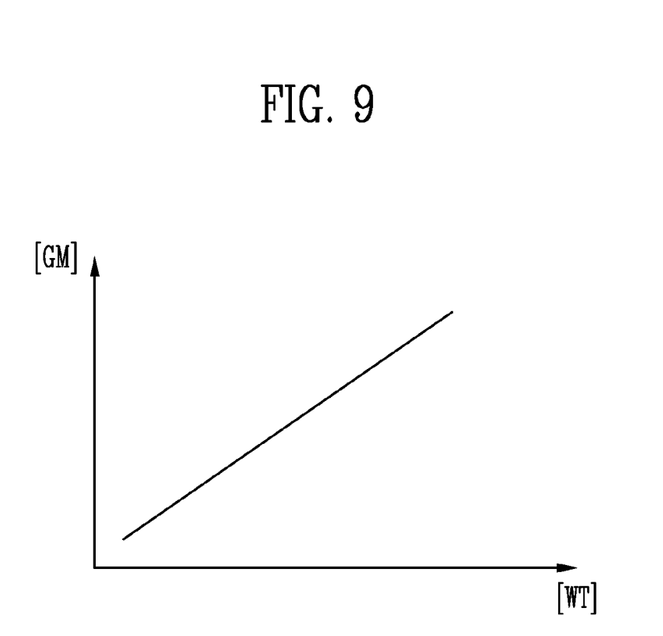
FIG. 9 is a graph illustrating a gain with respect to a width of a transistor according to an embodiment of the present disclosure.

FIG. 9 is a graph illustrating a gain GM with respect to a width WT of a transistor according to an embodiment of the present disclosure.

Referring to FIG. 9, as the width WT of the PMOS or NMOS transistor increases, a mobility of a carrier in the transistor may increase. Further, when the mobility of the carrier increases, the gain GM, which is the performance of the transistor, may increase. Therefore, the gain GM of the transistor may be proportional to the width WT of the transistor. For example, since the carrier is a hole in the PMOS transistor and the carrier is an electron in the NMOS transistor, in an embodiment, the width WT may be adjusted in consideration of the electrical characteristic of the PMOS or NMOS transistors. Here, adjusting the width of the transistors means manufacturing the transistors according to the width set in a manufacturing step of the monitoring circuit 1200 of FIG. 1.

Figure 10:
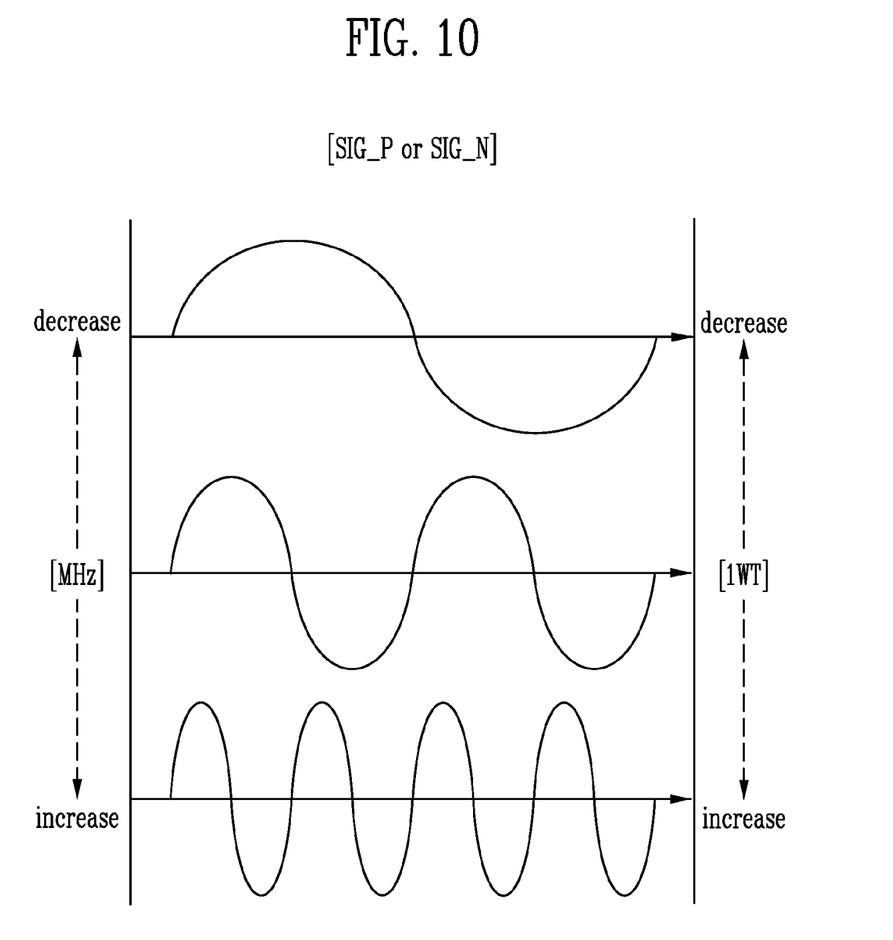
FIGS. 10 and 11 are diagrams illustrating a frequency of a voltage that varies based on a width of a transistor according to an embodiment of the present disclosure.
Figure 11:
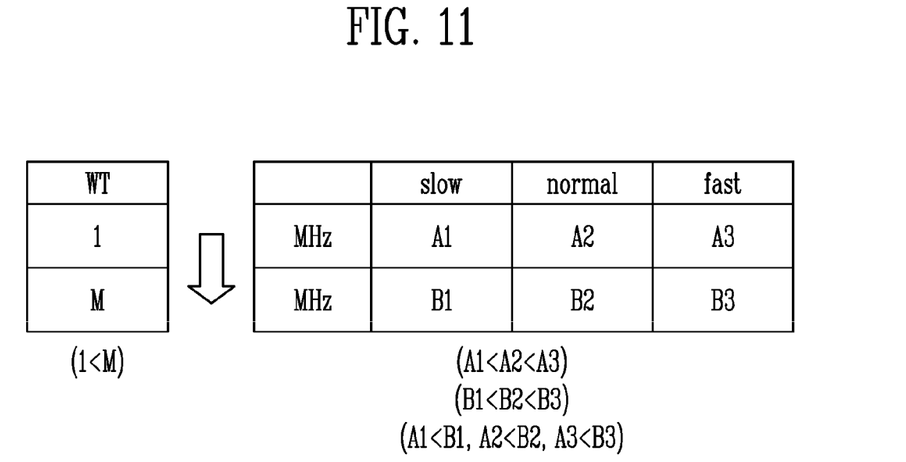

FIGS. 10 and 11 are diagrams illustrating a frequency of a voltage that varies based on a width of a transistor according to an embodiment of the present disclosure.

Referring to FIG. 10, when the width of the second boosting transistor 2B of FIG. 3 or the fourth boosting transistor 4B of FIG. 6 is increased or decreased based on the first width 1WT, a frequency MHz of the first or second sensing signal SIG_P or SIG_N output from the first oscillator 1OSC of FIG. 3 or the second oscillator 2OSC of FIG.

6 may increase or decrease according to the width of the transistor. For example, the frequency MHz of the signal output by the transistor having the first width 1WT is 2. In this case, when the width of the transistor decreases from the first width 1WT, the frequency MHz may decrease to 1, and when the width of the transistor increases from the first width 1WT, the frequency MHz may increase to 4. As another example, when the size of some transistors is increased as in the above-described embodiment, a signal having a frequency of 20 MHz in the related art may be output as a signal having a frequency of 40 MHz in an embodiment, and a signal of a frequency of 40 MHz in the related art may be output as a signal having a frequency of 80 MHz in an embodiment. When the frequency MHz of the first or second sensing signal SIG_P or SIG_N is increased, reliability of the frequency of the first and second sensing signals SIG_P and SIG_N operated by the operator 1110 of FIG. 1 may be improved.

Referring to FIG. 11, the electrical characteristics of a case where the width WT of the transistor is 1 and a case where the width WT of the transistor is M greater than 1 are compared as follows.

When the width WT of the transistor is 1, a frequency MHz of a signal generated by a transistor of which an operation speed is slow is A1, a frequency MHz of a signal generated by a transistor of which an operation speed is normal is A2, and a frequency MHz of a signal generated by a transistor of which an operation speed is fast is A3. Since the frequency MHz is proportional to the operation speed, A2 is greater than A1 and A3 is greater than A2.

When the width WT of the transistor is M greater than 1, the frequency MHz of the signal generated by the transistor of which the operation speed is slow is B1, the frequency MHz of the signal generated by the transistor of which the operation speed is normal is B2, and the frequency MHz of the signal generated by the transistor of which the operation speed is fast is B3. Since the frequency MHz is proportional to the operation speed, B2 is greater than B1 and B3 is greater than B2.

When the width WT of the transistor increases, the frequency may increase while the gain of the transistor increases. Therefore, B1 is greater than A1, B2 is greater than A2, and B3 is greater than A3.

That is, the frequency of the first or second sensing signal SIG_P or SIG_N of FIG. 1 generated in the case where the width WT of the transistor is M greater than 1 is higher than that of the case where the width WT of the transistor is 1. Therefore, since it becomes easy for the operator 1110 of FIG. 1 to operate frequencies of signals, the reliability of the operation may be increased.

The embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments may be combined to form additional embodiments.

What is claimed is:
1. A monitoring circuit comprising:
a booster configured to amplify a current amount between a power voltage terminal to which a power voltage is applied and a ground terminal to generate a sensing voltage; and
an oscillator configured to output a sensing signal of which a frequency is adjusted in response to the sensing voltage,
wherein the booster includes a first transistor having a first size and a second transistor having a second size greater than the first size, the first and second transistors being of a same conductivity type,
wherein the first transistor and the second transistor are coupled in series between the power voltage terminal and the ground terminal, and
wherein the oscillator includes a plurality of transistors having a third size greater than the first size.

2. The monitoring circuit of claim 1, wherein the booster includes the first transistor and the second transistor connected in series between the terminal to which the power voltage is applied and the ground terminal.

3. The monitoring circuit of claim 2, wherein the first transistor is adjacent to the terminal to which the power voltage is applied and has the first size, and the second transistor is adjacent to the ground terminal and has the second size.

4. The monitoring circuit of claim 2, wherein the first transistor is adjacent to the ground terminal and has the first size, and the second transistor is adjacent to the terminal to which the power voltage is applied and has the second size.

5. The monitoring circuit of claim 2, wherein the sensing voltage is generated at a gate of the first transistor.

6. The monitoring circuit of claim 2, wherein a gate of the first transistor is connected to the oscillator and a node between the first transistor and second transistor.

7. The monitoring circuit of claim 2, wherein a gate of the second transistor is connected to the ground terminal or the terminal to which the power voltage is applied.

8. The monitoring circuit of claim 1, wherein the oscillator includes a plurality of stages configured to output the sensing signal of which the frequency is adjusted in response to the sensing voltage.

9. The monitoring circuit of claim 8, wherein each of the plurality of stages includes a third transistor and an inverter connected in series between the terminal to which the power voltage is applied and the ground terminal.

10. The monitoring circuit of claim 9, wherein the third transistor has the third size, and outputs a sub voltage in response to the sensing voltage.

11. The monitoring circuit of claim 10, wherein the inverter is configured to receive the sub voltage as a voltage source and receive a signal output from an inverter included in a previous stage as an input signal.

12. The monitoring circuit of claim 11, wherein the inverter included in a last stage among the plurality of stages outputs the sensing signal, and
wherein the sensing signal is fed back to an inverter included in a first stage among the plurality of stages.

13. A monitoring circuit comprising:
a first sensing circuit including PMOS transistors having different lengths of channels, and configured to output a first sensing signal of which a first frequency is adjusted according to a current generated by the PMOS transistors, the first sensing circuit including a first booster comprising the PMOS transistors having the different lengths of channels; and a second sensing circuit including NMOS transistors having different lengths of channels, and configured to output a second sensing signal of which a second frequency is adjusted according to a current generated by the NMOS transistors, the second sensing circuit including second booster comprising the NMOS transistors having the different lengths of channels.

14. The monitoring circuit of claim 13, wherein the first sensing circuit comprises:
the first booster including a first transistor having a first length and a second transistor having a second length greater than the first length, and configured to output a first sensing voltage generated according to a current amount between the first transistor and second transistor; and
a first oscillator configured to output the first sensing signal of which the first frequency is adjusted in response to the first sensing voltage.

15. The monitoring circuit of claim 14, wherein the first oscillator has a ring oscillator structure.

16. The monitoring circuit of claim 15, wherein the first oscillator comprises:
a plurality of PMOS transistors having a third length greater than the first length; and
a plurality of inverters configured to receive a sub voltage output from the plurality of PMOS transistors as a voltage source, and output the first sensing signal in response to an input signal.

17. The monitoring circuit of claim 13, wherein the second sensing circuit comprises:
the second booster including a third transistor having a fourth length size and a fourth transistor having a fifth length size greater than the fourth length, and configured to output a second sensing voltage generated according to a current amount between the third transistor and fourth transistor; and a second oscillator configured to output the second sensing signal of which the second frequency is adjusted in response to the second sensing voltage.

18. The monitoring circuit of claim 17, wherein the second oscillator has a ring oscillator structure.

19. The monitoring circuit of claim 18, wherein the second oscillator comprises:
a plurality of inverters configured to receive a voltage as a voltage source and output the second sensing signal in response to an input signal; and
a plurality of NMOS transistors forming a current path between the inverters and a ground terminal, and having a sixth length greater than the fourth length.

20. An electronic system comprising:
a booster including first and second transistors of a same conductivity type coupled in series between a power voltage terminal and a ground terminal and configured to output, through a first node, a sensing voltage corresponding to characteristics of the first and second transistors; and
an oscillator including a plurality of stages in a ring structure and configured to output a sensing signal through a second node in response to the sensing voltage, a frequency of the sensing signal being adjusted in proportion to the sensing voltage,
wherein each of the plurality of stages incudes a pair of a third transistor and an inverter coupled in series between the power voltage terminal and the ground terminal, and
wherein the first transistor has a first size, the second transistor has a second size greater than the first size, the third transistor of each of the plurality of stages has a third size greater than the first size, and each of the first to third size indicates a length of a channel formed between two adjacent junction regions in a substrate.

* * * * *